(12) United States Patent
Noda et al.

(10) Patent No.: US 6,903,667 B2
(45) Date of Patent: Jun. 7, 2005

(54) DATA CONVERSION APPARATUS AND DATA CONVERSION METHOD

(75) Inventors: Chosaku Noda, Kawasaki (JP); Hideo Ando, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/743,089

(22) Filed: Dec. 23, 2003

(65) Prior Publication Data

US 2004/0183704 A1 Sep. 23, 2004

(30) Foreign Application Priority Data

Dec. 27, 2002 (JP) .................................. 2002-382261

(51) Int. Cl.$^7$ .................................................. H03M 7/00
(52) U.S. Cl. ........................................... 341/58; 341/59
(58) Field of Search .............................. 341/58, 59, 69

(56) References Cited

U.S. PATENT DOCUMENTS 5,451,943 A  * 9/1995 Satomura ..................... 341/58
5,742,243 A  * 4/1998 Moriyama ..................... 341/59
6,300,886 B1 * 10/2001 Hayami ........................ 341/59
6,559,779 B2   5/2003 Noda et al.
6,737,996 B2 * 5/2004 Kurokawa et al. ............ 341/68
2001/0017594 A1 * 8/2001 Ahn ............................. 341/59
2002/0118125 A1 * 8/2002 Noda et al. ................... 341/58

FOREIGN PATENT DOCUMENTS

JP          06195887 A  * 7/1994 ........... G11B/20/14
JP          2000-105981    4/2000
JP          2000-332613   11/2000

* cited by examiner

*Primary Examiner*—Howard L. Williams
(74) *Attorney, Agent, or Firm*—Oblon, Spivak, McClelland, Maier & Neustadt, P.C.

(57) ABSTRACT

A data conversion apparatus of this invention has a storage unit configured to store a conversion table to convert m-bit data into n-bit data, and a conversion unit configured to convert the m-bit data into the n-bit data by using the conversion table stored in the storage unit. The conversion table contains a plurality of bit conversion codes to convert the m-bit data into the n-bit data. The bit conversion code is a code which converts the m-bit data into the n-bit data that allows the minimum number d of consecutive "0" bits between "1" bits.

4 Claims, 5 Drawing Sheets

| Data | STATE 0 | | STATE 1 | |
|------|---------|------|---------|------|
|      | Code    | Next | Code    | Next |
| 0    | 10100*  | 0    | 00100*  | 0    |
| 1    | 101000  | 1    | 001000  | 1    |
| 2    | 101001  | 1    | 001001  | 1    |
| 3    | 10010*  | 0    | 01010*  | 0    |
| 4    | 100100  | 1    | 010100  | 1    |
| 5    | 100101  | 1    | 010101  | 1    |
| 6    | 101010  | 0    | 00010*  | 0    |
| 7    | 101010  | 1    | 000100  | 1    |
| 8    | 100010  | 0    | 000101  | 1    |
| 9    | 100010  | 1    | 01000*  | 0    |
| 10   | 10000*  | 0    | 010000  | 1    |
| 11   | 10000*  | 1    | 010001  | 1    |
| 12   | 000010  | 0    | 001010  | 0    |
| 13   | 000010  | 1    | 001010  | 1    |
| 14   | 00000*  | 0    | 010010  | 0    |
| 15   | 00000*  | 1    | 010010  | 1    |

| Data | STATE 0 | | | STATE 1 | |
|---|---|---|---|---|---|
| | Code | Next | | Code | Next |
| 0 | 10100* | 0 | | 00100* | 0 |
| 1 | 101000 | 1 | | 001000 | 1 |
| 2 | 101001 | 1 | | 001001 | 1 |
| 3 | 10010* | 0 | | 01010* | 0 |
| 4 | 100100 | 1 | | 010100 | 1 |
| 5 | 100101 | 1 | | 010101 | 1 |
| 6 | 101010 | 0 | | 00010* | 0 |
| 7 | 101010 | 1 | | 000100 | 1 |
| 8 | 100010 | 0 | | 000101 | 1 |
| 9 | 100010 | 1 | | 01000* | 0 |
| 10 | 10000* | 0 | | 010000 | 1 |
| 11 | 10000* | 1 | | 010001 | 1 |
| 12 | 000010 | 0 | | 001010 | 0 |
| 13 | 000010 | 1 | | 001010 | 1 |
| 14 | 00000* | 0 | | 010010 | 0 |
| 15 | 00000* | 1 | | 010010 | 1 |

FIG. 1

| Conversion state | 2T repetition limiting method |
|---|---|
| Sequence of "10*" (end) + "00000*" | * is always set to "1" |
| Two data "6" of STATE 0 continue | "100100" and "00000*" are assigned, and STATE 0 is designated as next STATE |
| Two data "5" of STATE 0 continue | "100100" and "00000*" are assigned, and STATE 1 is designated as next STATE |

FIG. 2

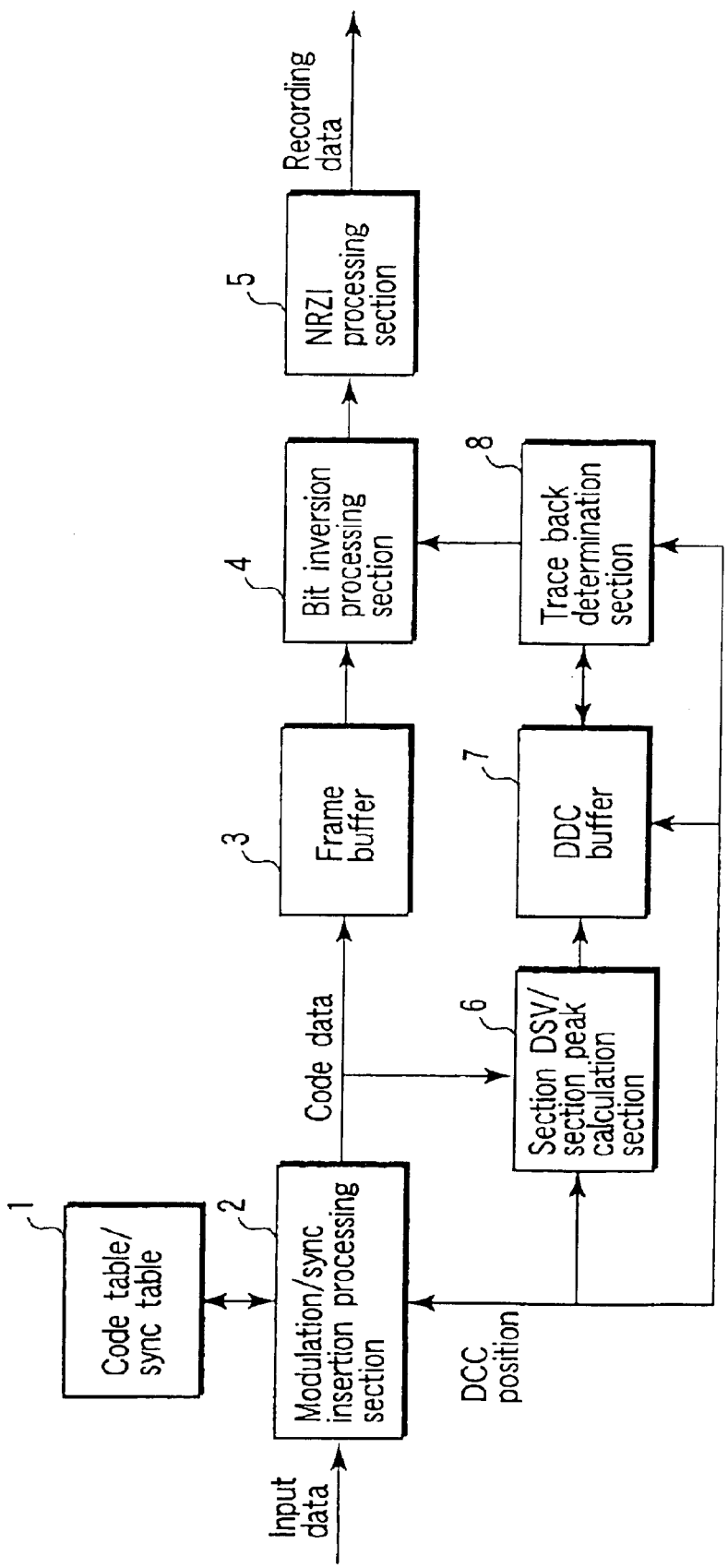
F I G. 5

| Run length | Number of times of occurrence | Occupation amount | Occurence frequency | Occupation ratio |
|---|---|---|---|---|
| 1T | 0 | 0 | 0.0% | 0.0% |
| 2T | 16441037 | 32882074 | 38.4% | 22.5% |
| 3T | 10779337 | 32338011 | 25.1% | 22.1% |
| 4T | 6926478 | 27705912 | 16.2% | 18.9% |
| 5T | 3741146 | 18705730 | 8.7% | 12.8% |
| 6T | 2520047 | 15120282 | 5.9% | 10.3% |
| 7T | 1265335 | 8857345 | 3.0% | 6.1% |
| 8T | 644226 | 5153808 | 1.5% | 3.5% |
| 9T | 286904 | 2582136 | 0.7% | 1.8% |
| 10T | 132286 | 1322860 | 0.3% | 0.9% |
| 11T | 0 | 0 | 0.0% | 0.0% |
| 12T | 131040 | 1572480 | 0.3% | 1.1% |
| 13T | 0 | 0 | 0.0% | 0.0% |
| TOTAL | 42867836 | 146240638 | 100.0% | 100.0% |

FIG. 6

| Run length | Number of times of occurrence | Occupation amount | Occurence frequency | Occupation ratio |
|---|---|---|---|---|
| 1T | 6130332 | 6130332 | 60.4% | 37.3% |
| 2T | 2487589 | 4975178 | 24.5% | 30.3% |
| 3T | 975148 | 2925444 | 9.6% | 17.8% |
| 4T | 387184 | 1548736 | 3.8% | 9.4% |
| 5T | 128157 | 640785 | 1.3% | 3.9% |
| 6T | 31425 | 188550 | 0.3% | 1.1% |
| 7T | 4548 | 31836 | 0.0% | 0.2% |
| 8T | 22 | 176 | 0.0% | 0.0% |
| 9T | 0 | 0 | 0.0% | 0.0% |
| 10T | 0 | 0 | 0.0% | 0.0% |
| TOTAL | 10144405 | 16441037 | 100.0% | 100.0% |

FIG. 7

| Minimum value | Maximum value | Average value | Distribution |
|---|---|---|---|
| -45 | 49 | -0.037 | 37.64 |

DATA CONVERSION APPARATUS AND DATA CONVERSION METHOD

CROSS-REFERENCE TO RELATED APPLICATIONS

This application is based upon and claims the benefit of priority from the prior Japanese Patent Application No. 2002-382261, filed Dec. 27, 2002, the entire contents of which are incorporated herein by reference.

BACKGROUND OF THE INVENTION

1. Field of the Invention

The present invention relates to a data conversion apparatus and method which convert m-bit data into n-bit data.

2. Description of the Related Art

Generally, binary data recorded on an optical disk is converted (modulated) into a code with a suppressed DC component. The minimum number of "0" bits between "1" bits in the converted (modulated) code sequence is represented by d. The maximum number of "0" bits between "1" bits is represented by k. The code used for modulation is called a (d, k) code.

A current DVD (Digital Versatile Disk) employs a (2, 10) code for modulation. In recent years, the data playback technology from optical disks has improved, and a PRML (Partial Response Maximum Likelihood) technique is employed. Accordingly, employment of a "d=1" modulation code suitable for a high density has been examined.

For example, Jpn. Pat. Appln. KOKAI Publication No. 2000-105981 (reference 1) discloses a technique in which the above-described "d=1" modulation code is employed, and additionally, a DC suppressing inversion bit is added to the end of a converted code.

In addition, Jpn. Pat. Appln. KOKAI Publication No. 2000-332613 (reference 2) discloses a technique in which the above-described "d=1" modulation code is employed to convert 4-bit data into 6-bit data.

In the technique disclosed in reference 1, however, since 8-bit data is converted into 12-channel bit data, $2^8=256$ or more conversion patterns are necessary. As a result, the conversion table size becomes large, and modulation/demodulation processing (conversion processing) is complicated.

In the technique disclosed in reference 2, since 4-bit data is converted into 6-channel bit data, only $2^4=16$ conversion patterns suffice. As a consequence, the conversion table size is small. However, since the conversion table requires four states, the problem of complex modulation/demodulation processing is not solved.

BRIEF SUMMARY OF THE INVENTION

According to an aspect of the present invention, there is provided a data conversion apparatus comprising a storage unit configured to store a conversion table to convert m-bit data into n-bit data, and a conversion unit configured to convert the m-bit data into the n-bit data by using the conversion table stored in the storage unit, wherein the conversion table contains a plurality of bit conversion codes to convert the m-bit data into the n-bit data, the bit conversion code is a code which converts the m-bit data into the n-bit data that allows the minimum number d of consecutive "0" bits between "1" bits, a code at an end of at least one of all the bit conversion codes in the conversion table is an inversion bit for DC suppression, and the inversion bit selects one of "0" and "1" in accordance with a predetermined condition.

According to an aspect of the present invention, there is provided a data conversion method of converting m-bit data into n-bit data, comprising converting the m-bit data into the n-bit data by using a conversion table, wherein the conversion table contains a plurality of bit conversion codes to convert the m-bit data into the n-bit data, the bit conversion code is a code which converts the m-bit data into the n-bit data that allows the minimum number d of consecutive "0" bits between successive "1" bits, a code at an end of at least one of all the bit conversion codes in the conversion table is an inversion bit for DC suppression, and the inversion bit selects one of "0" and "1" in accordance with a predetermined condition.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing an example of data conversion tables used for data conversion by a data conversion method and apparatus according to one embodiment of the present invention;

FIG. 2 is a table for explaining exceptional cases of data conversion by the data conversion method and apparatus according to one embodiment of the present invention;

FIG. 5 is a schematic block diagram showing an example of the data conversion apparatus according to the present invention;

FIG. 6 is a table for explaining the run occurrence frequency in data converted by the data conversion method and apparatus according to one embodiment of the present invention;

FIG. 7 is a table showing the evaluation result of the number of times of repetition of fine pattern (2T) in data converted by the data conversion method and apparatus according to one embodiment of the present invention;

DETAILED DESCRIPTION OF THE INVENTION

Figure 3:
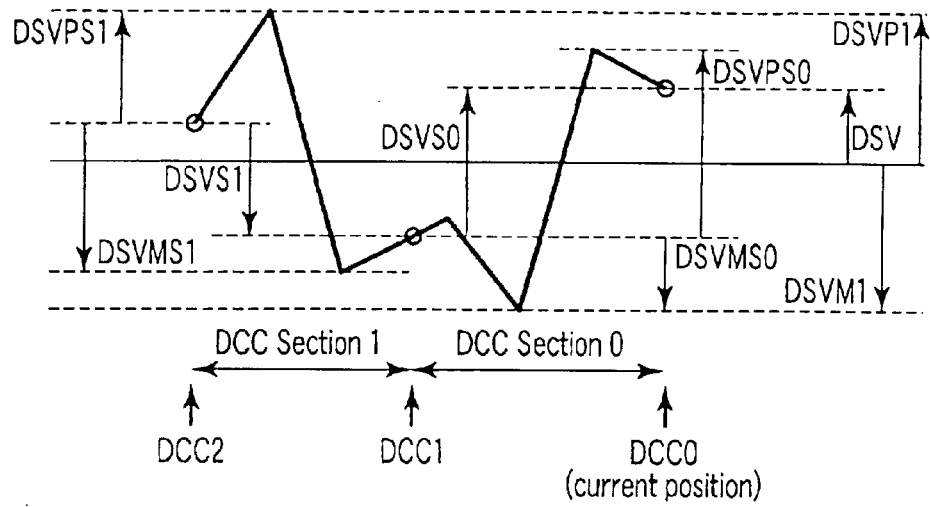
FIG. 3 is a graph for explaining various symbols related to trace back DCC control applied to the present invention.

The embodiment of the present invention will be described below with reference to the accompanying drawing.

FIG. 1 is a view showing an example of conversion tables used for data conversion by a data conversion apparatus and method according to the present invention. The data conversion method and apparatus of the present invention allow 1 as the minimum number of consecutive "0" bits between successive "1" bits (d=1). In addition, 4-bit data is converted into 6-bit data by using two (two states) conversion tables including a fixed length block code that converts 4 bits into 6 bits. At least one of converted codes has a DC suppressing inversion bit * at its end. In the conversion code shown in FIG. 1, the minimum number k of consecutive "0" bits between successive "1" bits can be k=8.

By using the conversion tables shown in FIG. 1, 4-bit data is converted into 6-bit data. Accordingly, the data conversion method and apparatus of the present invention can obtain the following functions and effects.

(1) Since the fixed length block code scheme is employed, modulation/demodulation processing can be simplified.

(2) The conversion unit of the fixed length block code is set as small as 4 bits →6 bits. In addition, only two states are set as states after conversion. With this arrangement, the conversion table size can be reduced, and modulation/demodulation processing can be simplified.

(3) The "inversion bit *" is set to the last channel bits of some conversion codes. When the bit of the "inversion bit *" is controlled ("inversion bit *"="0" or "1"), DC control can relatively easily be executed.

(4) When pattern replacement processing is executed for a specific pattern after conversion, the 2T repetition frequency in the converted code can be limited.

FIG. 1 is a view showing an example of conversion tables for "4–6 conversion". There can exist 16 patterns of 4-bit data before conversion. Two conversion states (STATE) are present in correspondence with each of the 16 patterns. Each conversion code is assigned the next STATE number to designate the state (STATE) that should be selected for conversion of next data.

Some conversion codes have the "inversion bit *" that is set to the last channel bits. The value of the "inversion bit *" is selected such that the DSV (Digital Sum Value) value for a channel bit data sequence after conversion becomes close to "0". With this method, DC control can be executed in the present invention (this will be described later in detail). The "inversion bit *" is always present at the last channel bit position of the converted code. Since the position where the "inversion bit *" can exist is always known in advance, the value of the "inversion bit *" can relatively easily be determined.

The conversion tables shown in FIG. 1 will be described below.

(A) Codes after conversion, which start with "0", and in which a run length of "0" channel bits from the start is three or less, are put into a group "STATE 1".

(B) Codes except (A), i.e., codes which start with "1" or "0", and in which a run length of "0" channel bits including the start bit is four or more are put into a group "STATE 0".

(C) When the last channel bit of a code after conversion is "1", STATE 1 always should be selected as the next STATE.

As described above, for example, the present invention is based on a modulation (conversion) scheme that satisfies d=1. The conversion code (modulation scheme) with d=1 inhibits a run of "1" bits as a code sequence after modulation (conversion). In this modulation scheme, at least one "0" bit must be inserted between "1" bits. In the above structure, when "1" exists as the last channel bit of a converted code, as indicated by (C), STATE 1 is selected. In STATE 1, "0" always exists at the start of the next conversion code, as indicated by (A), so that the conversion rule "d=1" is automatically satisfied. Hence, in the present invention, any new mechanism need not be introduced to inhibit a run of "1" bits. With only the characteristic features (A) to (C), the conversion rule "d=1" can be satisfied. For this reason, conversion processing can be simplified.

The conversion tables shown in FIG. 1 also will be described below.

(D) The channel bit immediately before the inversion bit is always "0". Hence, even when "1" is selected as the inversion bit, the code never have a run of two "1" bits including the channel bit immediately before the inversion bit. Without introducing any new mechanism to inhibit a run of "1" bits, the conversion rule "d=1" can be satisfied. For this reason, conversion processing can be simplified.

(E) When the number of consecutive "0" bits immediately before the inversion bit is three or less, STATE 0 is selected for the next conversion to increase the number of consecutive "0" bits.

(F) When the number of consecutive "0" bits immediately before the inversion bit is four or more, either STATE can be selected.

With the description (E) and (F), the DC control effect can be improved.

In data recorded on an optical disk, the local recording density is high in a place where "2T" is repeatedly recorded. For this reason, the amplitude of a playback signal that is played back from the place where "2T" is repeatedly recorded is very small, and a signal detection error readily occurs. In the present invention, to increase the signal detection reliability, the "2T" signal repetition frequency in a channel bit sequence after modulation is limited, as shown in FIG. 2. More specifically, pattern replacement processing is executed for a specific pattern after conversion, thereby limiting the 2T repetition frequency in the converted code.

When STATE 0 is employed for data "6" before conversion in FIG. 1, and STATE 1 is employed for data "5" before conversion, "2T" is repeated in the converted data. When data containing two data "6" before conversion is converted by employing STATE 0 of the conversion tables shown in FIG. 1, the converted code is "101010101010". When data containing two data "5" before conversion is converted by employing STATE 1 of the conversion tables shown in FIG. 1, the converted code is "010101010101". In these cases, "1" is generated six times in the 12-channel bit code after conversion. If the "1" occurrence frequency becomes high as in the above-described cases, another conversion code is assigned, as shown in FIG. 2.

More specifically, data containing two data "6" before conversion should originally be converted into "101010101010". However, the data is converted into "100100"+"00000*". In addition, STATE 0 is designated as STATE for the next conversion. Data containing two data "5" before conversion should originally be converted into "010101010101". However, the data is converted into "010100"+"00000*". In addition, STATE 1 is designated as STATE for the next conversion.

As the DC suppressing inversion bit * that exists at the end of some conversion codes in the conversion tables shown in FIG. 1, "0" or "1" is selected in accordance with a predetermined condition. The selection method will be described below.

In data converted by the data conversion apparatus and method of the present invention, the DC component is suppressed by a trace back method. First, various symbols related to the trace back DCC control method will be defined with reference to FIG. 3.

1. Definition of Symbols

DCCn: the position of the nth preceding DCC code from the current position (latest code)

DSV: the DSV value at the current position

POL: the inversion state at the current position (whether the number of times of inversion is even or odd)

DSVPn: the positive DSV peak value from the current position to DCCn+1

DSVMn: the negative DSV peak value from the current position to DCCn+1

DSVSn: the DSV value of a section until DCCn based on DCCn+1

DSVSPn: the positive DSV peak value of a section until DCCn based on DCCn+1

DSVSMn: the negative DSV peak value of a section until DCCn based on DCCn+1

DCCIn: the inversion/non-inversion state of DCCn

2. Section Value Calculation Method

The section value can easily be calculated by fixing the polarity of a DCC bit. However, a today's program calculates the section value on the basis of the state after DCC processing without prefetching.

DSV calculation is done at a DCC bit position in a DCC code (including a SYNC). In other codes, the calculation is done at the LSB position. However, since the DCC bit is fixed by the LSB, correction processing is easy. The hold of a peak value is also calculated on the basis of the same standard.

The procedures of the trace back DCC control method will be described next with reference to FIG. 3.

3. Procedures of Trace Back DCC Control Method (1) The DSV peak values (DSVP1 and DSVM1) in the section from DCC0 to DCC2 are obtained.

Peak calculation is executed retrospectively from DSV and POL. That is, DSVP1 is obtained from DSVS0, DSVS1, DSVPS0, DSVPS1, DCCI0, and DCCI1. DSVM1 is obtained from DSVS0, DSVS1, DSVMS0, DSVMS1, DCCI0, and DCCI1.

(2) DSV peak values when DCC2 and DCC1 are simultaneously inverted are obtained.

When the sections of DCC2 and DCC1 are in the same inversion states as in section value calculation, the peak values are obtained by subtracting 2×DSVS1 from DSVP1 and DSVM1. When the sections of DCC2 and DCC1 are in inversion states reverse to those in section value calculation, the peak values are obtained by adding 2×DSVS1 to DSVP1 and DSVM1.

(3) Execution of simultaneous inversion processing is determined from the four DSV peak values.

The absolute values of the four DSV peak values are calculated and compared.

Simultaneous inversion processing is selected such that the peak having the largest absolute value is eliminated.

(4) DSV, DCCI1, and DCCI2 are updated in accordance with the selection result.

(5) DSVP2 and DSVM2 in the section from DCC0 to DCC3 are obtained next in a similar way.

(6) The DSV peak values are compared with DSV peak values obtained when DCC3 and DCC2 are simultaneously inverted.

(7) Execution of simultaneous inversion processing is determined.

(8) DSV, DCCI2, and DCCI3 are updated in accordance with the selection result.

(9) The above processing is repeated while increasing the length of the calculation section until a predetermined number of DCC codes.

The above-described processing is executed every time a DCC code or a SYNC is detected.

4. Example of DCC Processing

Figure 4:
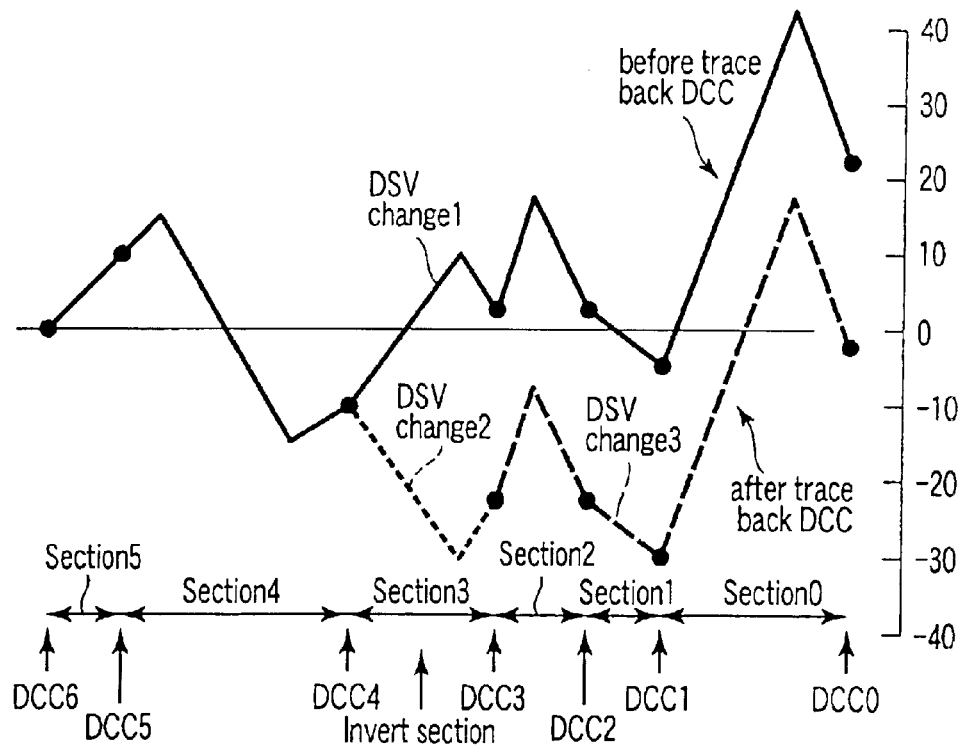
FIG. 4 is a graph for explaining the effects of trace back DCC control applied to the present invention.

FIG. 4 shows an example of effects by the above processing.

DSV change 1 shown in FIG. 4 indicates a DSV change in DCC processing without prefetching. When trace back DCC processing is executed for this DSV change, the following operation is executed.

(1) Check of Simultaneous Inversion States of DCC2 and DCC1

Since the positive DSV peak becomes large after simultaneous inversion, the simultaneous inversion processing is not executed.

(2) Check of Simultaneous Inversion States of DCC3 and DCC2

Since the DSV peak values do not change, the simultaneous inversion processing can be either executed or omitted. In this example, simultaneous inversion is not executed.

(3) Check of Simultaneous Inversion States of DCC4 and DCC3

When the simultaneous inversion processing is not executed, the positive DSV peak is maximum. Hence, simultaneous inversion processing of DCC4 and DCC3 is executed. Only the DSV change in the sections of DCC4 and DCC3 is inverted (DSV change 2 shown in FIG. 4). The DSV from DCC3 is wholly shifted in the negative direction by 2×DSVS3 (DSV change 3 shown in FIG. 4).

As a result, the DSV peak values are suppressed.

5. Example of Circuit Arrangement

FIG. 5 is a block diagram showing the schematic arrangement of the data conversion apparatus according to the present invention. In other words, the data conversion apparatus has circuits necessary for trace back DCC. As shown in FIG. 5, the data conversion apparatus comprises a code table/sync table 1, modulation/sync insertion processing section 2, frame buffer 3, bit inversion processing section 4, NRZI processing section 5, section DSV/section peak calculation section 6, DCC buffer 7, and trace back determination section 8.

The code table/sync table 1 stores the conversion tables shown FIG. 1 and sync codes. The modulation/sync insertion processing section 2 converts (modulates) input data on the basis of the conversion tables shown in FIG. 1. More specifically, the modulation/sync insertion processing section 2 converts input 4-bit data into 6-bit data and inserts a sync code every predetermined data length. The code table/sync table 1 also stores information that limits the "2T" signal repetition frequency shown in FIG. 2. With this information, the "2T" signal repetition frequency is limited.

The frame buffer 3 can buffer, e.g., several sync frames. One sync frame is constituted by a sync code and converted data. Only one data sequence after temporary determination is stored in the frame buffer 3. To save the capacity of the frame buffer 3, a limitation on the maximum number of frames may be added to the section of trace back.

The section DSV/section peak calculation section 6 calculates a section DSV and section peak, as described above. The DCC buffer 7 stores the DCC positions, inversion states, and section values. The trace back determination section 8 executes trace back determination on the basis of the information stored in the DCC buffer 7. That is, the trace back determination section 8 executes addition/subtraction and absolute value comparison for the respective values in the DCC buffer 7.

The bit inversion processing section 4 inverts the DC suppressing inversion bit * in accordance with the trace back determination result of the trace back determination section 8. That is, the DC suppressing inversion bit * is set to "1" or "0". The modulation table is unnecessary for inversion processing after trace back determination.

The NRZI processing section 5 outputs an NRZI pattern which inverts the output in accordance with a "1" bit and holds the output in accordance with a "0" bit.

FIG. 6 is a table for explaining the run occurrence frequency in data converted by the data conversion method according to the present invention. As shown in FIG. 6, the occurrence frequency is highest for 2T. The second highest occurrence frequency is for 3T. The occurrence frequency distribution shown in FIG. 6 corresponds to the result of 2T repetition control shown in FIG. 2. When the control is executed, the 2T occupation ratio (22.5%) decreases and almost equals the 3T occupation ratio (22.1%).

FIG. 7 is a table showing the evaluation result of the number of times of repetition of fine pattern (2T) in data converted by the data conversion method according to the present invention. As is apparent from FIG. 7, when the 2T repetition control shown in FIG. 2 is executed, the repetition frequency of two 2Ts (24.5%) is much lower than the repetition frequency of one 2T (60.4%).

Figures 8, 9:
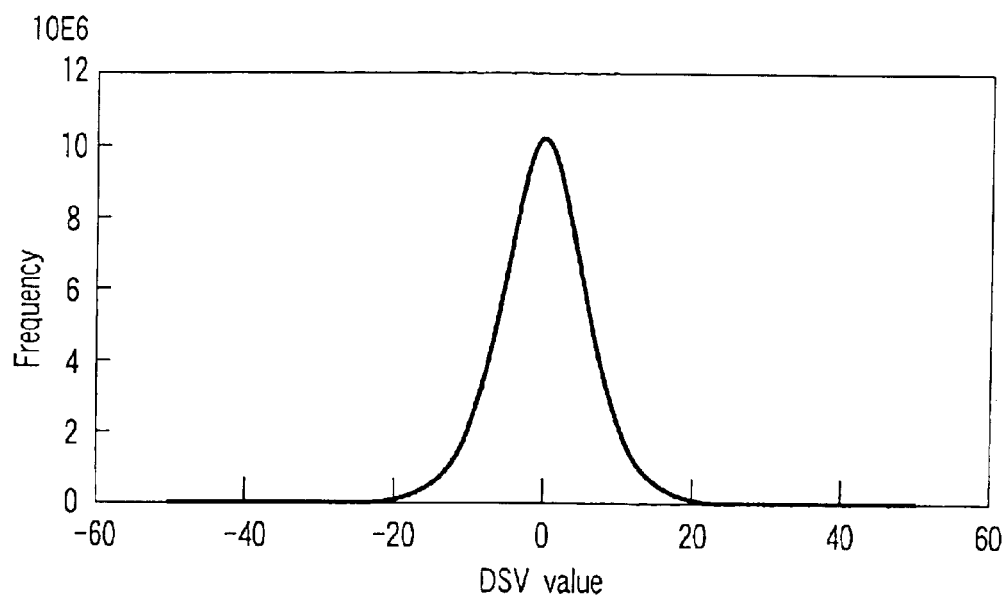
FIG. 8 is a graph showing the DSV characteristic evaluation result of data converted by the data conversion method and apparatus according to one embodiment of the present invention.
FIG. 9 is a table that summarizes the DSV characteristic evaluation result shown in FIG. 8.

FIGS. 8 and 9 are views showing the DSV characteristic evaluation result of data converted by the data conversion method according to the present invention. As is apparent from FIGS. 8 and 9, when the above-described trace back DCC control is executed, the distribution is small, and the DSV value converges to 0.

As has been described above, in the present invention, the following functions and effects are obtained by employing the "d=1" modulation method.

(1) The conversion table can be simplified (the conversion table size can be reduced), and conversion processing can be facilitated. In addition, since the conversion table is simple, highs-speed conversion can be executed.

(2) DC control can be executed by a simple method. Hence, highly accurate playback can be executed.

(3) The 2T repetition frequency can be limited, and playback signal detection can be stabilized. Hence, highly accurate playback can be executed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data conversion apparatus comprising:

a storage unit configured to store first and second conversion tables to convert predetermined 4-bit data into 6-bit data, and a conversion unit configured to convert the predetermined 4-bit data into the 6-bit data by using one of the first and second conversion tables stored in the storage unit, wherein each of the first and second conversion tables includes 16 6-bit conversion codes to convert 16 4-bit data into 16 6-bit data, the 6-bit conversion code in the first and second conversion tables is a code which converts the 4-bit data into the 6-bit data that allows 1 as the minimum number of consecutive "0" bits between successive "1" bits, a code at an end of at least one of all the 6-bit conversion codes in the first and second conversion tables is an inversion bit for DC suppression, and the inversion bit selects one of "0" and "1" in accordance with a predetermined condition.

2. An apparatus according to claim 1, wherein each 6-bit conversion code contained in the first and second conversion tables stored in the storage unit contains information to designate a conversion table to be used for next data conversion.

3. A data conversion method of converting predetermined 4-bit data into 6-bit data, comprising:

converting the predetermined 4-bit data into the 6-bit data by using one of first and second conversion tables, wherein each of the first and second conversion tables includes 16 6-bit conversion codes to convert 16 4-bit data into 16 6-bit data, the 6-bit conversion code in the first and second conversion tables is a code which converts the 4-bit data into the 6-bit data that allows 1 as the minimum number of consecutive "0" bits between successive "1" bits, a code at an end of at least one of all the 6-bit conversion codes in the first and second conversion tables is an inversion bit for DC suppression, and the inversion bit selects one of "0" and "1" in accordance with a predetermined condition.

4. A method according to claim 3, wherein each 6-bit conversion code contained in the first and second conversion tables contains information to designate a conversion table to be used for next data conversion.

* * * * *